United States Patent
Komizo et al.

(10) Patent No.: US 11,067,886 B2
(45) Date of Patent: Jul. 20, 2021

(54) REFLECTIVE PHOTOMASK BLANK AND REFLECTIVE PHOTOMASK

(71) Applicant: TOPPAN PRINTING CO., LTD., Tokyo (JP)

(72) Inventors: Toru Komizo, Tokyo (JP); Norihito Fukugami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/625,652

(22) PCT Filed: Jun. 29, 2018

(86) PCT No.: PCT/JP2018/024890
§ 371 (c)(1),
(2) Date: Dec. 20, 2019

(87) PCT Pub. No.: WO2019/009212
PCT Pub. Date: Jan. 10, 2019

(65) Prior Publication Data
US 2020/0218143 A1  Jul. 9, 2020

(30) Foreign Application Priority Data
Jul. 5, 2017  (JP) .............................. JP2017-132027

(51) Int. Cl.
*G03F 1/24* (2012.01)
*G03F 1/58* (2012.01)

(52) U.S. Cl.
CPC . *G03F 1/24* (2013.01); *G03F 1/58* (2013.01)

(58) Field of Classification Search
CPC .................................... G03F 1/24; G03F 1/58
USPC .......................................................... 430/5
See application file for complete search history.

(56) References Cited

U.S. PATENT DOCUMENTS 8,962,220 B2 * 2/2015 Matsuo ................. B82Y 40/00
                                                              430/5
2012/0021344 A1  1/2012 Matsuo

FOREIGN PATENT DOCUMENTS

| JP | 2010-103463 A | 5/2010 |
| JP | 2011-176162 A | 9/2011 |
| JP | 2018-120009 A | 8/2018 |
| WO | WO 2010/113700 A1 | 10/2010 |

OTHER PUBLICATIONS

Extended European Search Report for European Patent Application No. 18827918.6, 8 pages, dated Jul. 6, 2020.
Tadashi Matsuo et al., "Novel Absorber Material for EUV lithography Maks", Proceedings of SPIE/IS & T, IEEE, US, vol. 7379, pp. 1-8, DOI:10.1117/12.824330.
International Preliminary Report on Patentability for PCT International Application No. PCT/JP2018/024890 with translation, 10 pages, dated Jan. 7, 2020.
International Search Report and Written Opinion for PCT International Application No. PCT/JP2018/024890 with translation, 19 pages, dated Jan. 7, 2020.

* cited by examiner

*Primary Examiner* — Christopher G Young
(74) *Attorney, Agent, or Firm* — Squire Patton Boggs (US) LLP

(57) ABSTRACT

A reflective photomask blank (10) of a first aspect includes a substrate (1); a reflective layer (2) formed on the substrate (1); and a light absorbing layer (4) formed on the reflective layer (2) and including a tin oxide film with a film thickness of 17 nm or more and less than 25.0 nm. Consequently, the shadowing effect of a reflective photomask for pattern transfer using extreme ultraviolet light as a light source is suppressed or reduced to improve the performance of transfer to a semiconductor substrate, and further, pattern collapse due to cleaning of the reflective photomask is suppressed.

4 Claims, 8 Drawing Sheets

REFLECTIVE PHOTOMASK BLANK AND REFLECTIVE PHOTOMASK

CROSS-REFERENCE

This application is a 35 U.S.C. 371 filing of International Application No. PCT/JP2018/024890 filed on Jun. 29, 2018, which claims priority to Japanese Application No. JP 2017-132027 filed on Jul. 5, 2017, both of which are incorporated verbatim herein by reference in their entirety, including the specifications, drawings, and the claims.

TECHNICAL FIELD

The present invention relates to a reflective photomask for use in lithography that uses extreme ultraviolet light as a light source, and to a reflective photomask blank for use in producing the reflective photomask.

BACKGROUND ART

With the miniaturization of semiconductor devices, the demand for the miniaturization of the photolithography technology has been increasing in the semiconductor device manufacturing process. The minimum resolution size of a transfer pattern in the photolithography largely depends on the wavelength of an exposure light source and can be reduced as the wavelength decreases. Therefore, in order to realize further miniaturization of transfer patterns, exposure light sources are shifting from conventional ArF excimer lasers (wavelength 193 nm) to EUV (Extreme Ultra Violet) with a wavelength of 13.5 nm.

The EUV is absorbed by most materials at high rates. Therefore, in the EUV lithography, it is not possible to use a refractive optical system that makes use of the transmission of light, and it is also not possible to use a transmissive photomask. Consequently, a reflective photomask is used as a photomask for EUV exposure (an EUV mask).

PTL 1 discloses an EUV photomask obtained by forming a light reflective layer on a glass substrate, the light reflective layer composed of a multilayer film in which molybdenum (Mo) layers and silicon (Si) layers are alternately laminated, forming a light absorbing layer mainly containing tantalum (Ta) on the light reflective layer, and forming a pattern in the light absorbing layer.

Further, as a component constituting an optical system of an exposure apparatus, a lens or a transmission beam splitter cannot be used, while a reflective component such as a mirror is used. Consequently, it is not possible to design such that incident light to the EUV mask and reflected light from the EUV mask proceed on the same axis. Therefore, usually, in the EUV lithography, EUV is made incident with its optical axis inclined at 6 degrees to the direction perpendicular to the EUV mask surface, and reflected light with its optical axis inclined at 6 degrees to the side opposite to the incident light is directed toward a semiconductor substrate.

CITATION LIST

Patent Literature

PTL 1: JP 2011-176162 A

SUMMARY OF INVENTION

Technical Problem

In this way, in the EUV lithography, since the optical axis is inclined, the incident light on the EUV mask generates a shadow of a mask pattern (a patterned light absorbing layer) of the EUV mask. The problem caused by the generation of the shadow is called the shadowing effect. The shadowing effect is the theoretical problem of the EUV lithography where the optical axis is inclined.

In a current EUV mask blank, a film having a film thickness of 60 to 90 nm and mainly containing tantalum (Ta) is used as a light absorbing layer. When exposure for pattern transfer is performed using an EUV mask produced from this mask blank, there is a possibility that the contrast is reduced at an edge portion in the shadow of a mask pattern depending on a relationship between the incident direction and the orientation of the mask pattern. Consequently, there is a possibility of occurrence of a problem such as an increase in the line edge roughness of a transferred pattern on a semiconductor substrate or a deviation of its line width from the target dimension, resulting in degradation of the transfer performance.

Further, a current EUV mask has a problem that pattern collapse occurs due to cleaning at the time of production thereof.

It is an object of the present invention to suppress or reduce the shadowing effect of a reflective photomask for pattern transfer using extreme ultraviolet light as a light source, thereby improving the performance of transfer to a semiconductor substrate, and to suppress pattern collapse due to cleaning of the reflective photomask.

Solution to Problem

In order to solve the above-described problems, a first aspect of the present invention is a reflective photomask blank for producing a reflective photomask for pattern transfer using extreme ultraviolet light as a light source, the reflective photomask blank including: a substrate; a reflective layer formed on the substrate; and a light absorbing layer formed on the reflective layer, the light absorbing layer including a tin oxide film with a film thickness of 17 nm or more and less than 25.0 nm.

A second aspect of the present invention is a reflective photomask including: a substrate; a reflective layer formed on the substrate; and a light absorbing pattern layer formed on the reflective layer and patterned, the light absorbing pattern layer including a tin oxide film with a film thickness of 17 nm or more and less than 25.0 nm.

Advantageous Effects of Invention

According to the present invention, it can be expected that the shadowing effect of a reflective photomask for pattern transfer using extreme ultraviolet light as a light source is suppressed or reduced to improve the performance of transfer to a semiconductor substrate, and that pattern collapse due to cleaning of the reflective photomask is suppressed.

DESCRIPTION OF EMBODIMENTS

Embodiment

Hereinafter, an embodiment of the present invention will be described, but the present invention is not limited to the embodiment described below. In the embodiment described below, limitation that is technically preferable for carrying out the present invention is made, but this limitation is not an essential feature of the present invention.

Figure 1:
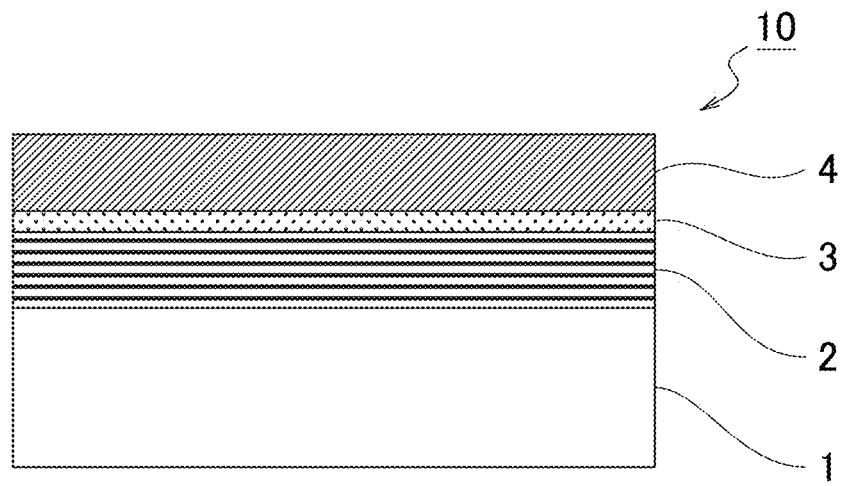
FIG. 1 is a sectional view illustrating a reflective photomask blank of an embodiment of the present invention.

As illustrated in FIG. 1, a reflective photomask blank 10 of this embodiment includes a substrate 1, a reflective layer 2 formed on the substrate 1, a capping layer 3 formed on the reflective layer 2, and a light absorbing layer 4 formed on the capping layer 3. The light absorbing layer 4 is composed of a tin oxide film with a film thickness of 17 nm or more and less than 25.0 nm. A substrate made of low-expansion synthetic quartz or the like is used as the substrate 1.

Figure 2:
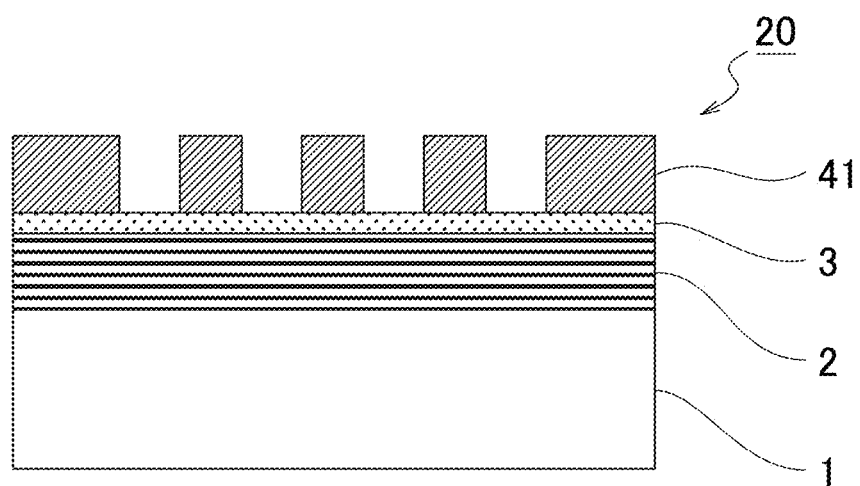
FIG. 2 is a sectional view illustrating a reflective photomask of the embodiment of the present invention.

As illustrated in FIG. 2, a reflective photomask 20 of this embodiment includes the substrate 1, the reflective layer 2 formed on the substrate 1, the capping layer 3 formed on the reflective layer 2, and a light absorbing pattern layer 41 formed on the capping layer 3. The light absorbing pattern layer 41 is composed of a tin oxide film with a film thickness of 17 nm or more and less than 25.0 nm. The light absorbing pattern layer 41 is formed by patterning the light absorbing layer 4 of the reflective photomask blank 10.

[Consideration for Reaching the Present Invention]

(About Light Absorbency of Absorbing Film)

A light absorbing layer (hereinafter also referred to simply as an "absorbing layer") of a reflective photomask blank is dry-etched and formed into a predetermined exposure transfer pattern and serves to absorb irradiated EUV. In order to reduce the shadowing effect, which is the problem to be solved, the absorbing layer should be made thin. However, when Ta (tantalum), which is the material generally used currently, is simply made thin, the absorbency for EUV is not sufficient so that the reflectance in an absorbing layer region becomes high. Therefore, in order to simultaneously achieve the film thinning of the absorbing layer and its light absorbency for EUV, a material having higher light absorbency for EUV than the existing absorbing layer material is required.

(About Drawback of High Absorption Material)

Figure 3:
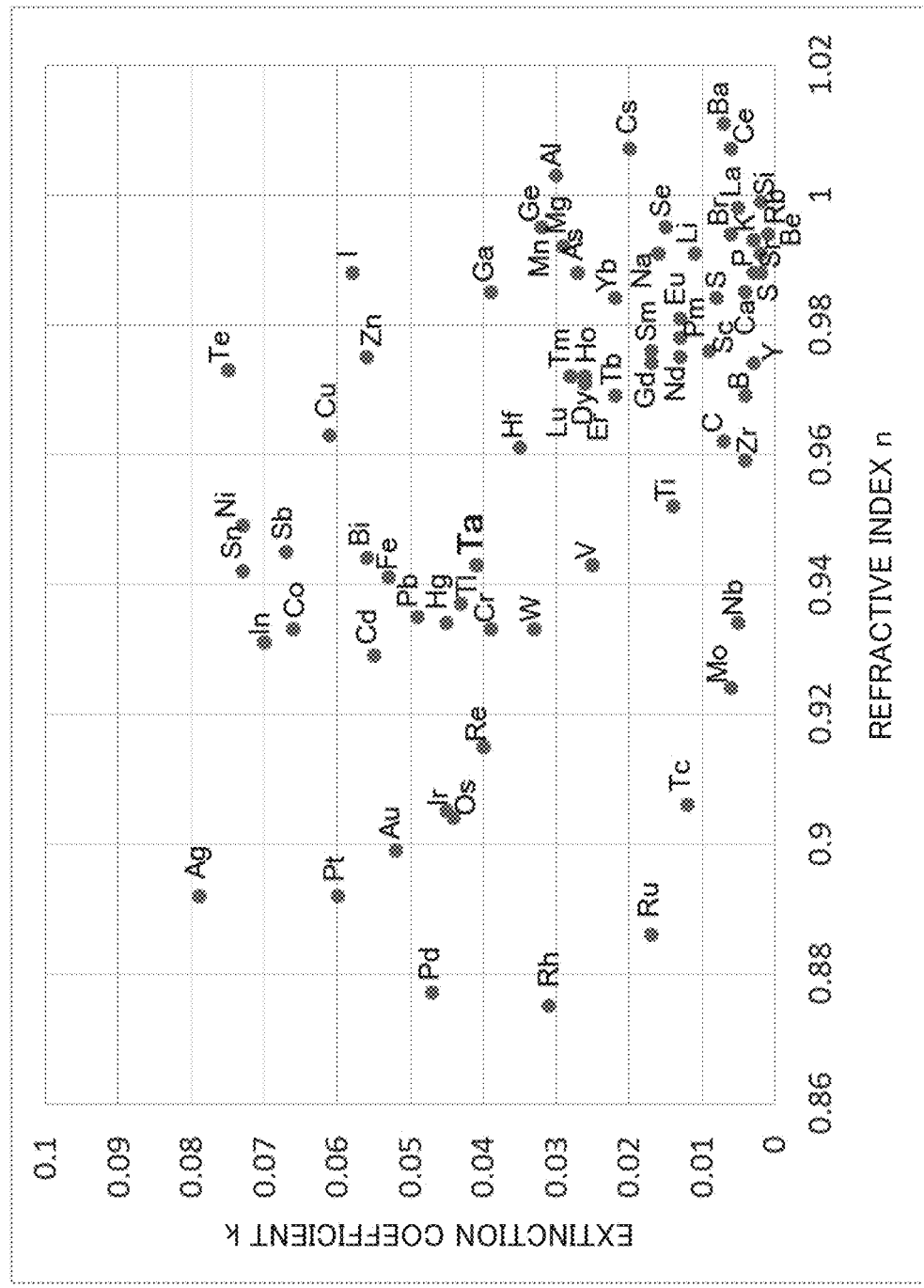
FIG. 3 is a graph illustrating optical constants of metal materials at the wavelength of EUV.

FIG. 3 illustrates optical constants of metal materials at the wavelength of the EUV region, wherein the abscissa axis represents the refractive index n and the ordinate axis represents the extinction coefficient k. There are Ag, Ni, Sn, Te, and the like as a material having a high extinction coefficient k. The extinction coefficients of these materials are in a range from 0.07 to 0.08 and are about twice the extinction coefficient 0.041 of Ta which is the conventional absorbing layer material. That is, these materials have high light absorbency. However, these high absorption materials cannot be patterned due to their poor dry-etchability (volatility of halides of these elements is low) or cannot withstand the heat at the time of producing a photomask or at the time of EUV exposure due to their low melting points, and therefore, most of them are not suitable for practical use as a light absorbing layer material of a photomask.

(About Relationship Between Melting Point and Chemical Resistance of Tin Oxide Film)

Figure 4:
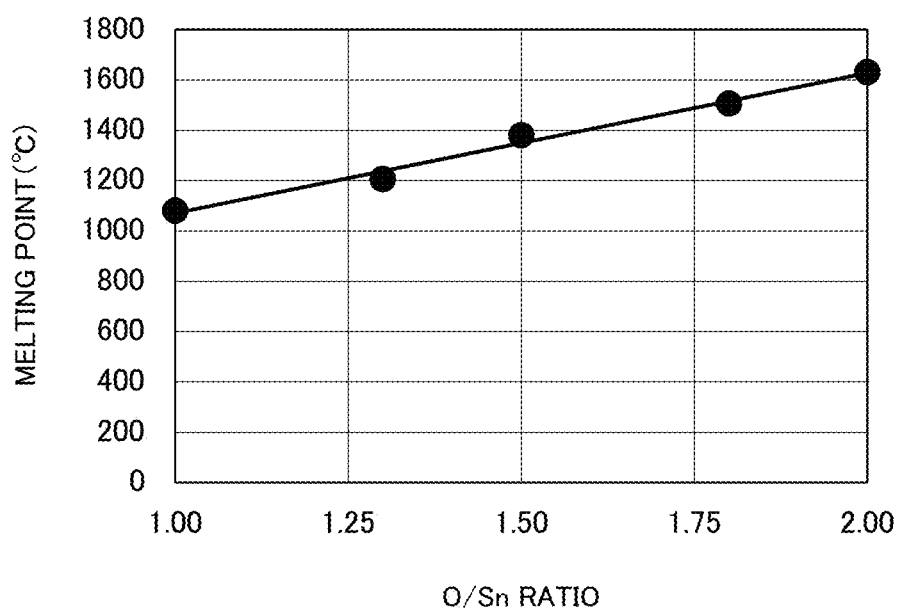
FIG. 4 is a graph illustrating the relationship between the ratio (O/Sn) of oxygen to tin contained in a tin oxide film and the melting point thereof.

In order to avoid such a drawback, it was decided to use a tin oxide film as a light absorbing layer of a reflective photomask blank and a reflective photomask. While a simple substance of Sn has a low melting point, around 230° C., and thus has a problem in thermal stability and cleaning resistance, the melting point can be made 1000° C. or more as illustrated in FIG. 4 by using a tin oxide film. Consequently, since the tin oxide film has sufficient resistance to heat at the time of producing a photomask or at the time of EUV exposure and is also chemically stable due to chemical bonding between Sn and O, it is possible to ensure sufficient resistance to a cleaning solution (acid or alkali) at the time of producing the mask.

Further, while the tin oxide film is chemically stable, it can be dry-etched with a chlorine-based gas and thus can be patterned. The reason for this is that volatility of $SnCl_4$, which is a compound of Sn and Cl, is higher than that of a compound of a high absorption material other than Sn and Cl.

(About Relationship Between O/Sn Ratio and Light Absorbency of Tin Oxide Film)

Optical constants (extinction coefficient and refractive index) for EUV hardly differ between tin oxide with an O/Sn ratio of 1.0 or more and 2.0 or less and tin alone. Therefore, using a tin oxide film with the O/Sn ratio of 1.0 or more and 2.0 or less as a light absorbing layer of a reflective photomask blank and a reflective photomask, it is possible to maintain the same light absorbency as when a light absorbing layer is Sn alone.

Actually, a plurality of tin oxide film samples in which the content of oxygen was changed in a range where the O/Sn ratio was 1.0 or more and 2.0 or less was prepared, and the optical constants thereof at a wavelength of 13.5 nm (EUV region) were measured. As a result, values were obtained for each of the samples such that refractive index n=0.930 to 0.940 and extinction coefficient k=0.0714 to 0.0728. These are values close to values of the simple substance of Sn illustrated in FIG. 3. That is, the optical constants of the tin oxide with the O/Sn ratio of 1.0 or more and 2.0 or less and the optical constants of the simple substance of Sn are approximately the same.

(Comparison of Reflectance, OD, and Film Thickness Between Ta Film and Tin Oxide Film)

Based on the optical constants (refractive index n=0.936, extinction coefficient k=0.0721) of the tin oxide film, the EUV reflectance when using a light absorbing layer made of the tin oxide was calculated. Further, the OD value (Optical Density: contrast between an absorbing layer portion and a reflective layer portion) indicating the basic performance of a mask was calculated using the following formula (1).

$$OD=-\log(Ra/Rm) \tag{1}$$

In the formula (1), Rm is a reflected light intensity from a reflective layer region, and Ra is a reflected light intensity from a light absorbing layer region.

Naturally, in the EUV lithography, the higher the OD value, the better. Note that, using a mask blank having a configuration in which a capping layer (protective layer) having a thickness of 2.5 nm and made of Ru was present under the absorbing layer, 40 pairs of reflective layers each made of Si and Mo were present under the capping layer, a flat substrate made of synthetic quartz was present under the reflective layers, and a conductive layer made of CrN was present on a back surface of the substrate, the calculation was performed by using optical constants (refractive index and extinction coefficient) of these layers and changing the film thickness of the light absorbing layer.

Figure 5:
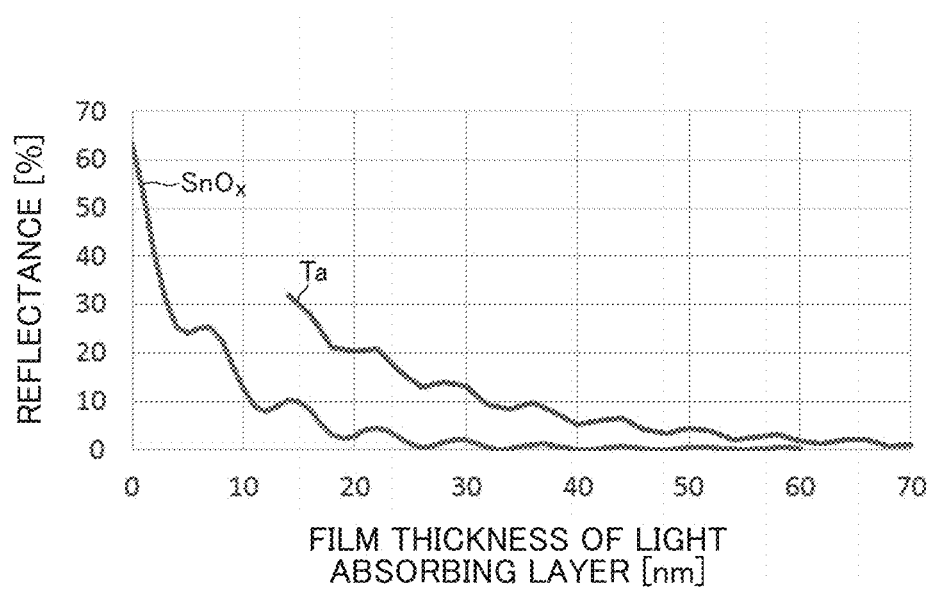
FIG. 5 is a graph illustrating the relationship between the film thickness of a light absorbing layer and the EUV reflectance thereof, which was obtained by calculation when the light absorbing layer was a tin oxide ($SnO_x$) film or a tantalum (Ta) film.

As seen from FIG. 5, in the case of a tin oxide ($SnO_x$) film, compared to a Ta film, for example, the reflectance can be reduced to half or less with the same film thickness, and the film thickness can be reduced to half or less with the same reflectance. In this way, the tin oxide film is effective as a light absorbing film.

Figure 6:
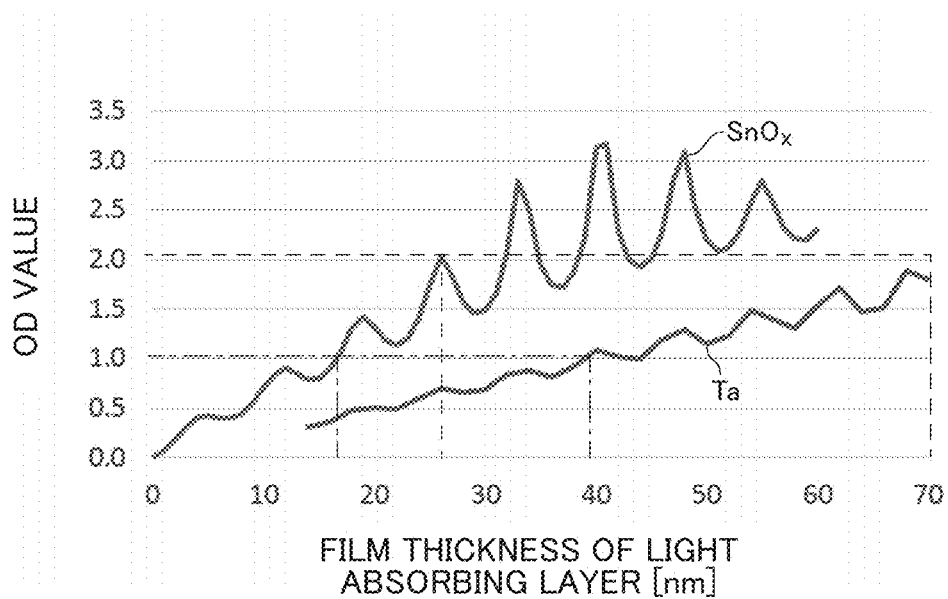
FIG. 6 is a graph illustrating the relationship between the film thickness of a light absorbing layer and the OD value, which was obtained by calculation when the light absorbing layer was a tin oxide ($SnO_x$) film or a tantalum (Ta) film.

As seen from FIG. 6, in order to obtain, for example, OD≥1.0, a Ta film requires a thickness of at least 40 nm or more, while a tin oxide ($SnO_x$) film requires only about 17 nm. Therefore, it is seen that, also in terms of the OD, the tin oxide film is effective as a light absorbing film that can reduce the film thickness.

In order to obtain OD=2.0, a Ta film requires a thickness of at least 70 nm or more, while a tin oxide film requires only 26 nm. Therefore, it is seen that, also at OD=2, the tin oxide film is effective as a light absorbing film that can reduce the film thickness.

In this way, using the tin oxide film, it is possible to thin the light absorbing layer while maintaining the OD value indicating the basic performance of the mask.

(Comparison of HV Bias Between Ta Film and Tin Oxide Film)

Next, in order to evaluate the influence of the shadowing effect, a comparison was made between a Ta film and a tin oxide film by simulation using a simulator according to the FDTD (Finite-Difference Time-Domain) method to observe the change in HV bias value when the film thickness was changed. The simulation conditions were such that the wavelength of a light source was set to 13.5 nm (EUV wavelength), NA was set to 0.33, the incident angle was set to 6 degrees, and a quasar was used for illumination.

The HV bias value is a line width difference of a transferred pattern that depends on the orientation of a mask pattern, i.e. a difference between a line width in the H (Horizontal) direction and a line width in the V (Vertical) direction. The line width in the H direction represents a line width in a direction parallel to a plane formed by incident light and reflected light, and the line width in the V direction represents a line width in a direction perpendicular to a plane formed by incident light and reflected light.

The horizontal pattern size is affected by the shadowing effect so that a reduction in contrast at an edge portion of a transferred pattern or a reduction in line width (Y-direction) thereof occurs. Since the pattern affected by the shadowing effect is reduced in line width after the transfer, the line width difference (i.e. HV bias) occurs between the vertical transferred pattern size and the horizontal transferred pattern size.

Figure 7:
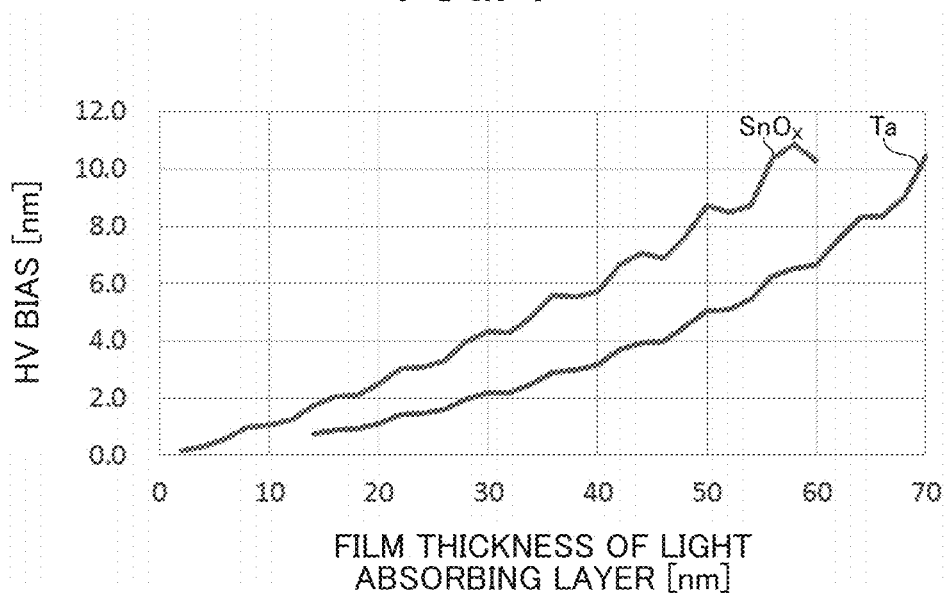
FIG. 7 is a graph illustrating the relationship between the film thickness of a light absorbing layer and the HV bias value of a pattern transferred by a photomask, which was obtained by calculation when the light absorbing layer was a tin oxide ($SnO_x$) film or a tantalum (Ta) film.

A pattern used in this simulation is a mask pattern designed to have a size of 16-nm LS (Line and Space are 1:1) on a semiconductor substrate. Therefore, since ¼ reduction projection exposure is usually used in the EUV lithography, the pattern size on an EUV mask is that of a 64-nm LS pattern. As illustrated in FIG. 7, it is seen that the HV bias value of the transferred pattern increases as the film thickness of the absorbing layer increases, for each of the Ta film and the tin oxide film.

Figure 8:
FIG. 8 is a graph illustrating the calculation results of HV bias values at OD values of 1.0 and 2.0, which were obtained when the light absorbing layer is a tin oxide ($SnO_x$) film or a tantalum (Ta) film.

Herein, as a result of comparison of HV bias values between a Ta film (film thickness 70 nm) and a tin oxide film (film thickness 26 nm) at OD=about 2, the HV bias value is 10.5 nm, i.e. very large, with the Ta film, while the HV bias value is 3.3 nm with the tin oxide film so that it is significantly reduced and improved (FIG. 8). Further, using a Ta film (40 nm) and a tin oxide film (17 nm) at OD=1, the HV bias is 3.2 nm with the Ta film and 2.1 nm with the tin oxide film.

In this way, it is seen that the influence of the shadowing effect (HV bias) can be significantly reduced by using tin oxide as a material of a light absorbing layer of a reflective photomask blank and a reflective photomask.

(Comparison of NILS Between Ta Film and Tin Oxide Film)

The influence of the shadowing effect also appears in pattern contrast called NILS (Normalized Image Log Slope). NILS is a characteristic value indicating an inclination between a light portion and a dark portion from a light intensity distribution of a transferred pattern. The greater the value, the better the pattern transfer properties (resolution, line edge roughness, etc.). Using optical constants of Ta and tin oxide forming light absorbing layers, NILS was evaluated by calculation (the same simulation as described above). The results are illustrated in FIG. 9.

Figure 9:
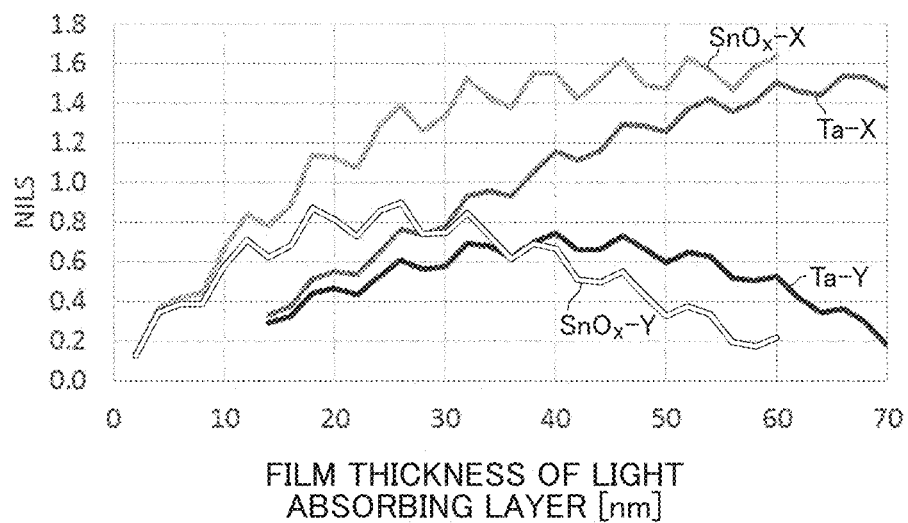
FIG. 9 is a graph illustrating the relationship between the film thickness of a light absorbing layer and the NILS (values in X- and Y-directions) of a pattern transferred by a photomask, which was obtained by calculation when the light absorbing layer was a tin oxide ($SnO_x$) film or a tantalum (Ta) film.

As illustrated in FIG. 9, in the case of a Ta film, with a film thickness of 70 nm where the OD becomes about 2, X (NILS in the vertical line width direction) is 1.5, and Y (NILS in the horizontal line width direction) is 0.2. That is, the NILS in the horizontal line width direction (Y-direction) that is affected by the shadowing effect is significantly degraded. Such a large difference between the X- and Y-direction pattern contrasts (NILSs) causes the large HV bias value with the Ta film as described above.

On the other hand, in the case of a tin oxide film, with a film thickness of 26 nm where the OD becomes about 2, X=1.4 and Y=0.9. Since the NILS in the Y-direction is significantly improved, the HV bias value is also reduced.

As is obvious, the reduction in NILS (pattern contrast) in the Y-direction not only affects the HV bias, but also leads to an increase in the line edge roughness of a transferred pattern, and in the worst case, leads to the impossibility of resolution, which is a serious problem.

As illustrated in FIG. 9, in the case of the tin oxide film with a film thickness of 17 nm or more and 36 nm or less, the NILS in the Y-direction can be made higher than the Ta film with any film thickness.

(Relationship Between Pattern Collapse and Film Thickness)

The relationship between the film thickness of a light absorbing layer and the pattern collapse due to cleaning of a photomask was examined. As a result, it has been found that, in the case of a tin oxide film, the pattern collapse tends to occur when the film thickness is 25.0 nm or more.

[About First Aspect and Second Aspect of the Present Invention]

A reflective photomask blank of a first aspect of the present invention and a reflective photomask of a second aspect of the present invention has a light absorbing layer including a tin oxide film with a film thickness of 17 nm or more and less than 25.0 nm.

Since the light absorbing layer of the reflective photomask blank of the first aspect of the present invention and the reflective photomask of the second aspect of the present invention includes the tin oxide film with the film thickness of 17 nm or more and less than 25.0 nm, the influence of the shadowing effect (degradation of pattern resolution and increase in line edge roughness) can be significantly improved compared to a reflective photomask blank and a reflective photomask having a light absorbing layer composed of a Ta film.

Compared to a reflective photomask blank and a reflective photomask having a light absorbing layer including a tin oxide film that does not satisfy the film thickness of 17 nm or more and less than 25.0 nm, the NILS in the Y-direction of the reflective photomask can be made high and therefore the influence of the shadowing effect can be made small, and further, it is possible to suppress pattern collapse due to cleaning of the reflective photomask.

The reflective photomask blank of the first aspect of the present invention and the reflective photomask of the second aspect of the present invention may have a light absorbing layer including a tin oxide film with a film thickness of 17.0 nm or more and less than 25.0 nm.

In the reflective photomask blank of the first aspect of the present invention and the reflective photomask of the second aspect of the present invention, it is satisfactory if the tin oxide film included in the light absorbing layer has an atomic ratio (O/Sn) of oxygen to tin that is in a range of 1.0 or more and 2.0 or less.

In the reflective photomask blank of the first aspect of the present invention and the reflective photomask of the second aspect of the present invention, a material forming the tin oxide film included in the light absorbing layer preferably contains 80 at % or more of tin (Sn) and oxygen (O) in total.

This is because when a component other than tin (Sn) and oxygen (O) is contained in the tin oxide film, the EUV absorbency by the tin oxide film is reduced, but when that component is less than 20 at %, a reduction in EUV absorbency is very small so that there is almost no reduction in performance as a light absorbing layer of an EUV mask.

As a material other than tin and oxygen, a metal such as Si, In, Te, Ta, Pt, Cr, or Ru, or a light element such as nitrogen or carbon may be mixed according to the purpose.

For example, by adding In to the tin oxide film, it is possible to impart conductivity to the film while ensuring the transparency, so that it is possible to enhance the inspectability in a mask pattern inspection using DUV light with a wavelength of 190 to 260 nm. Alternatively, when nitrogen or carbon is mixed to the tin oxide film, it is possible to increase the etching rate in dry etching of the tin oxide film.

In the reflective photomask blank of the first aspect of the present invention and the reflective photomask of the second aspect of the present invention, the OD (Optical Density) defined by the following formula (1) is preferably 1 or more.

$$OD = -\log(Ra/Rm) \quad (1)$$

where Rm is a reflected light intensity from a reflective layer, and Ra is a reflected light intensity from a light absorbing layer.

An exposure simulation was performed using a tin oxide film (film thickness less than 17 nm) where the OD was less than 1. As a result, it was found that a transferred pattern could not be formed due to lack of contrast between a light absorbing layer portion and a reflective layer portion. Likewise, in the case of a Ta film, a transferred pattern could not be formed when the OD was less than 1.

As described above, according to the reflective photomask blank of the first aspect of the present invention and the reflective photomask of the second aspect of the present invention, by having the light absorbing layer including the tin oxide film with the film thickness of 17 nm or more and less than 25.0 nm, the influence of the shadowing effect can be reduced. High NILS can be obtained in the Y-direction of a transferred pattern compared to the conventional product having the light absorbing layer composed of the Ta film. Therefore, it is possible to realize an improvement in the resolution of the transferred pattern and a reduction in the line edge roughness of the transferred pattern. Further, since the X- and Y-direction NILSs approach each other, the HV bias value can be reduced so that the transferred pattern faithful to a mask pattern can be obtained.

EXAMPLE

Hereinafter, an Example of the present invention will be described.

(Production of Reflective Photomask Blank)

Figure 10:
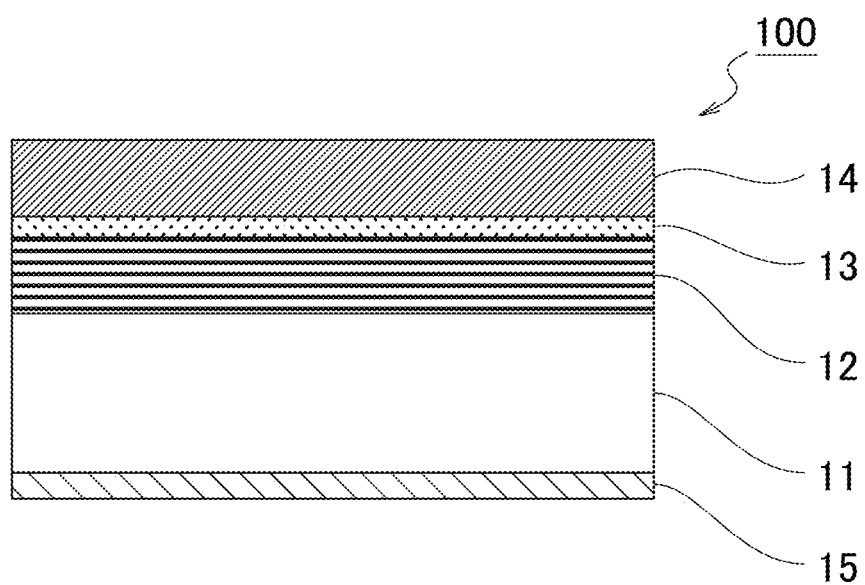
FIG. 10 is a sectional view illustrating a reflective photomask blank of an Example.

As a reflective photomask blank 100 with a layer structure illustrated in FIG. 10, a plurality of samples was produced in the following manner.

First, a reflective layer 12 of a multilayer structure composed of 40 pairs of Si and Mo (total film thickness 280 nm) was formed on a substrate 11 made of synthetic quartz, and a capping layer 13 composed of a Ru film was formed to a film thickness of 2.5 nm on the reflective layer 12. Then, a light absorbing layer 14 was formed on the capping layer 13. Then, a conductive layer 15 made of CrN was formed to a film thickness of 100 nm on a back surface of the substrate 11.

The light absorbing layer 14 was formed in each of the samples by changing the material (Ta or tin oxide) and the film thickness as indicated in Table 1. As the tin oxide films, SnO films with an O/Sn ratio of 1 (indicated as "SnO1" in Table 1) and $SnO_2$ films with an O/Sn ratio of 2 (indicated as "SnO2" in Table 1) were formed to film thicknesses of 26 nm, 25.0 nm, 24.5 nm, 17 nm, and 16 nm. The Ta films were formed to film thicknesses of 70 nm and 40 nm.

Each of the layers was formed using a sputtering apparatus. The tin oxide film was formed by a reactive sputtering method so that the O/Sn ratio became 1.0 or 2.0 by controlling the amount of oxygen introduced into a chamber during sputtering. The film thickness of each of the layers was measured by a transmission electron microscope, and the O/Sn ratio of the tin oxide film was measured by XPS (X-ray Photoelectron Spectroscopy).

(Measurement of Reflectance and Calculation of OD)

The reflectance Rm in a reflective layer region and the reflectance Ra in a light absorbing layer region of each of the Ta films and the tin oxide films were measured by an EUV reflectance measuring apparatus. From the results, the OD representing the mask property was calculated.

(Production of Reflective Photomask)

Using each sample of the obtained reflective photomask blank 100, a reflective photomask was produced in the following manner.

Figure 11:
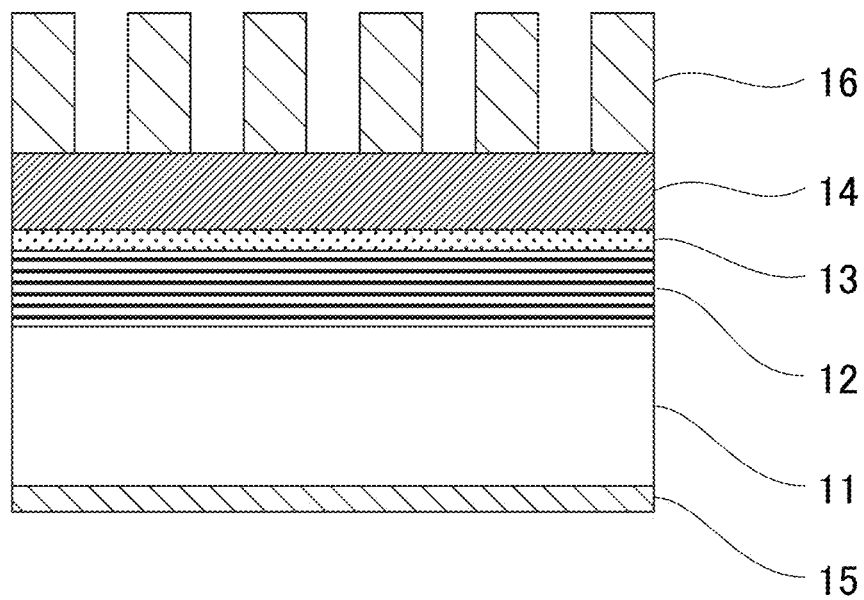
FIG. 11 is a sectional view for explaining one process of a method of producing a reflective photomask using the reflective photomask blank of the Example.

First, a positive chemically amplified resist (SEBP9012: manufactured by Shin-Etsu Chemical Co., Ltd.) was coated to a film thickness of 170 nm on the light absorbing layer 14 of the reflective photomask blank 100. Then, a predetermined pattern (40-nm 1:1 line and space pattern) was written on this resist film using an electron beam writing apparatus (JBX3030: manufactured by Japan Electronics Co., Ltd.). Then, a prebaking treatment was performed at 110° C. for 10 minutes, and then a developing treatment was performed using a spray developing apparatus (SFG3000: manufactured by Sigmameltec Ltd.). Consequently, as illustrated in FIG. 11, a resist pattern 16 was formed on the light absorbing layer 14.

Figure 12:
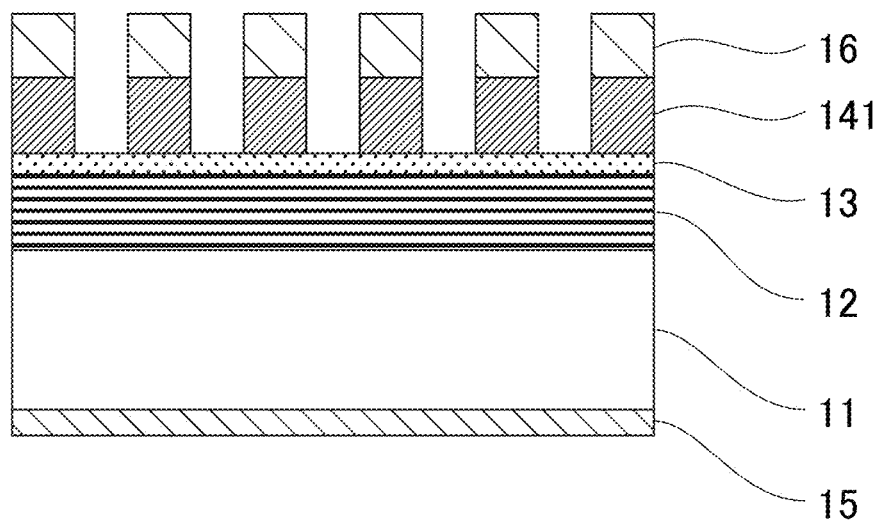
FIG. 12 is a sectional view for explaining a process subsequent to the process of FIG. 11 of the method of producing the reflective photomask using the reflective photomask blank of the Example.

Then, by dry etching using the resist pattern 16 as an etching mask, patterning of the light absorbing layer 14 was performed. In the sample in which the light absorbing layer 14 was the Ta film, an etching gas mainly composed of a fluorine-based gas was used. In the sample in which the light absorbing layer 14 was the tin oxide film, an etching gas mainly composed of a chlorine-based gas was used. Consequently, as illustrated in FIG. 12, the light absorbing layer 14 was made into a light absorbing pattern layer 141.

Figure 13:
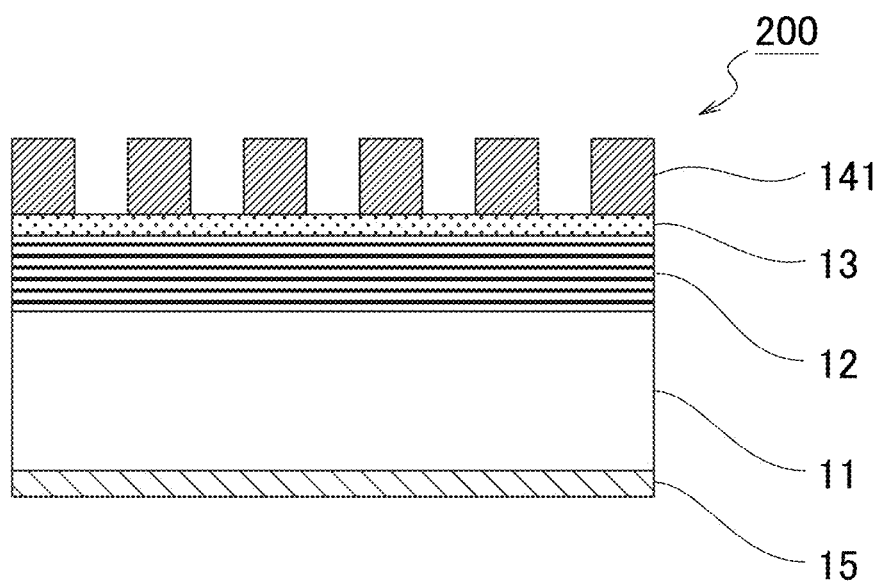
FIG. 13 is a sectional view illustrating a reflective photomask obtained in the Example.

Then, the resist pattern 16 was removed. Consequently, as illustrated in FIG. 13, each sample of a reflective photomask 200 was obtained in which the reflective layer 12 of the multilayer structure composed of the 40 pairs of Si and Mo (total film thickness 280 nm), the capping layer 13 composed of the 2.5-nm Ru film, and the light absorbing pattern layer 141 were formed in this order on the surface of the substrate 11 made of synthetic quartz, and the conductive layer 15 was formed on the back surface of the substrate 11 made of synthetic quartz.

(Wafer Exposure)

Using each sample of the obtained reflective photomask 200, a pattern of the light absorbing pattern layer 141 was transferred to an EUV positive chemically amplified resist film formed on a wafer, by exposure using an EUV exposure apparatus (NXE3300B manufactured by ASML Inc.).

(Evaluation of Transferred Pattern: HV Bias and Line Edge Roughness)

The resist pattern on the wafer thus formed was observed by an electron beam dimension measuring apparatus, thereby measuring the line width of the pattern.

In order to confirm the lithography properties, the X- and Y-direction dimensions of the resist pattern were measured and the difference therebetween was calculated, thereby confirming the HV bias value. The Y-direction dimension is affected by the shadowing effect. Further, the LER (Line Edge Roughness: roughness of pattern) of the resist pattern was also confirmed.

(Evaluation of Mask Pattern: Cleaning Resistance)

Each sample of the reflective photomask 200 produced by the above-described method, before being used for exposure, was used to perform an accelerated cleaning test, thereby examining whether or not collapse of a mask pattern occurred.

The accelerated cleaning test was performed by repeating APM (ammonium hydrogen-peroxide mixture) cleaning by 100 times under the following conditions. The conditions of the APM cleaning were set to ammonia: hydrogen peroxide water:water=1:1:5 (volume ratio), a temperature of 80° C., and an immersion time of 10 minutes.

The mask pattern after the accelerated cleaning was observed by a scanning electron microscope (SEM) to examine whether or not collapse of a line pattern occurred.

The results are collectively illustrated in Table 1.

TABLE 1

| | material property | | | simulation | | mask property | | lithography property | | accelerated cleaning |
|---|---|---|---|---|---|---|---|---|---|---|
| material | refractive index n | extinction coefficient k | film thickness | NILS-X | NILS-Y | OD | HV bias | resolution | LER | collapse |
| Ta | 0.94 | 0.041 | 70 nm | 1.5 | 0.2 | 1.8 | 11.1 | unresolved | — | — |
| | | | 40 nm | 1.2 | 0.7 | 1.1 | 3.5 | OK | 4.2 | NG |
| SnO1 | 0.94 | 0.072 | 26 nm | 1.4 | 0.9 | 2.0 | 3.5 | OK | 3.6 | NG |
| | | | 25.0 nm | 1.3 | 0.9 | 1.7 | 3.3 | OK | 3.7 | NG |
| | | | 24.5 nm | 1.3 | 0.9 | 1.6 | 3.1 | OK | 3.6 | OK |
| | | | 17 nm | 1.0 | 0.8 | 1.1 | 2.1 | OK | 3.8 | OK |
| | | | 16 nm | 0.9 | 0.7 | 0.9 | 2.0 | partially unresolved | 4.2 | — |
| SnO2 | 0.93 | 0.071 | 26 nm | 1.4 | 0.9 | 2.0 | 3.4 | OK | 3.7 | NG |
| | | | 25.0 nm | 1.4 | 0.9 | 1.3 | 3.3 | OK | 3.7 | NG |
| | | | 24.5 nm | 1.3 | 0.9 | 1.5 | 3.2 | OK | 3.6 | OK |
| | | | 17 nm | 1.0 | 0.8 | 1.0 | 2.1 | OK | 3.8 | OK |
| | | | 16 nm | 0.9 | 0.7 | 0.9 | 2.1 | partially unresolved | 4.3 | — |

As illustrated in Table 1, while the HV bias value was 11.1 nm in the case of the Ta film with the film thickness of 70 nm (OD=1.8), the HV bias value was 3.5 nm in the case of the SnO film with the film thickness of 26 nm (OD=2.0) and was 3.4 nm in the case of the $SnO_2$ film, and therefore, it was confirmed that the HV bias value was significantly improved.

The HV bias value was 2.1 nm in the case of the SnO film with the film thickness of 17 nm (OD=1.1) and was 2.1 nm in the case of the $SnO_2$ film with the film thickness of 17 nm (OD=1.0), and therefore, the reduction in HV bias value was observed by the film thinning. Likewise, the HV bias value was 3.5 nm in the case of the Ta film with the film thickness of 40 nm (OD=1.1), and therefore, the reduction in HV bias value was also observed by the film thinning, but the HV bias value reduction result was greater in the case of the tin oxide film than in the case of the Ta film.

In the case of the Ta film, the LER in the horizontal direction that was affected by the shadowing effect was unmeasurable due to being unresolved with the film thickness of 70 nm and was 4.2 nm with the film thickness of 40 nm. On the other hand, in the case of the SnO film and the SnO$_2$ film, the pattern was partially unresolved with the film thickness of 16 nm, but the LER was 3.8 nm or less and thus was satisfactory when the film thickness was 17 nm or more and 26 nm or less.

With respect to the cleaning resistance of the mask pattern, pattern collapse occurred in the accelerated cleaning test in the case of the Ta film and in the case of the SnO film and the SnO$_2$ film with the film thickness of 25.0 nm or 26 nm, but pattern collapse did not occur in the accelerated cleaning test in the case of the SnO film and the SnO$_2$ film with the film thickness of 24.5 nm or 17 nm.

From the results described above, it is confirmed that the actual mask properties (OD value) and the lithography properties (HV bias, resolution, line edge roughness) of a transferred pattern are improved compared to conventional ones and pattern collapse due to cleaning of a reflective photomask can be suppressed by using the reflective photomask blank of the first aspect of the present invention and the reflective photomask of the second aspect of the present invention.

REFERENCE SIGNS LIST 1 substrate
2 reflective layer
3 capping layer
4 light absorbing layer
41 light absorbing pattern layer
11 substrate
12 reflective layer
13 capping layer
14 light absorbing layer
141 light absorbing pattern layer
15 conductive layer
16 resist pattern
10 reflective photomask blank
20 reflective photomask
100 reflective photomask blank
200 reflective photomask

The invention claimed is:

1. A reflective photomask blank for producing a reflective photomask for pattern transfer using extreme ultraviolet light as a light source, the reflective photomask blank comprising:
   a substrate;
   a reflective layer including a multilayer film and formed on the substrate; and
   a light absorbing layer formed on the reflective layer, the light absorbing layer including a tin oxide film with a film thickness of 17 nm or more and less than 25.0 nm;
   wherein
   an atomic ratio (O/Sn) of oxygen (O) to tin (Sn) contained in the tin oxide film is 1.0 or more and 2.0 or less; and
   given that Rm is a reflected light intensity from the reflective layer and that Ra is a reflected light intensity from the light absorbing layer, an OD (Optical Density) defined by a formula (1) below is 1 or more and less than 1.5, $$OD = -\log(Ra/Rm) \tag{1}$$

2. The reflective photomask blank according to claim 1, wherein a material forming the tin oxide film contains 80 at % or more of tin (Sn) and oxygen (O) in total.

3. The reflective photomask blank according to claim 1, further comprising a capping layer formed between the light absorbing layer and the reflective layer.

4. The reflective photomask blank according to claim 2, further comprising a capping layer formed between the light absorbing layer and the reflective layer.

* * * * *